(12) United States Patent
Kasai

(10) Patent No.: US 6,350,978 B1
(45) Date of Patent: Feb. 26, 2002

(54) DETERIORATION SENSING DEVICE FOR LIGHT-EMITTING DIODE

(75) Inventor: Toshio Kasai, Tokyo (JP)

(73) Assignee: Asahi Kogaku Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/505,626

(22) Filed: Feb. 16, 2000

(30) Foreign Application Priority Data

Feb. 18, 1999 (JP) .......................................... 11-039763

(51) Int. Cl.[7] .................................................. G01J 1/32
(52) U.S. Cl. ...................................... 250/205; 347/236
(58) Field of Search ................................ 250/205, 235, 250/201.1, 204, 206, 217 R; 358/506, 509, 475; 347/236, 237, 238

(56) References Cited

U.S. PATENT DOCUMENTS 4,802,179 A  1/1989  Negishi 5,185,638 A  *  2/1993  Conzola et al. ............. 356/237

* cited by examiner

*Primary Examiner*—Que T. Le
(74) *Attorney, Agent, or Firm*—Greenblum & Bernstein, P.L.C.

(57) ABSTRACT

A deterioration sensing device comprises a laser diode (LD), a voltage-current converter supplying electric current to the LD to radiate a laser beam which is received by a photo-diode, and an APC circuit outputting electric voltage in accordance with the intensity of the laser beam sensed by the photo-diode. The voltage-current converter is controlled based on the electric voltage so that the intensity of the laser beam is kept constant. An LD deterioration circuit is provided with a comparator, in which the electric voltage is compared with a reference voltage. An LD deterioration control unit is provided in the LD deterioration circuit to output a deterioration signal when the electric voltage becomes higher than the reference voltage, so that an alarm, indicating that the LD has deteriorated, is output, and the electric current supplied to the LD is decreased.

14 Claims, 4 Drawing Sheets

DETERIORATION SENSING DEVICE FOR LIGHT-EMITTING DIODE

BACKGROUND OF THE INVENTION

1. Field of the Invention

The present invention relates to a device for sensing deterioration of a light-emitting diode such as a laser diode (LD), and more particularly, to a device for sensing deterioration of an output power of the LD.

2. Description of the Related Art

In an LD scanning device which utilizes an LD as a light source, a light intensity of the LD should be constant to generate a uniform or stable image pattern, and therefore, it is necessary that the light-emitting output of the LD is checked and, when the LD has deteriorated causing the light-emitting output to decrease, a proper treatment is applied to the LD scanning device. The LD has characteristics in which a light intensity increases with a linear relationship, as an electric current supplied to the LD increases past a threshold value of current at which the LD begins to emit a laser beam, and when the LD has deteriorated, the characteristics are changed, so that the inclination of the linear relationship becomes less, or that the threshold value increases. Thus, when an electric current is supplied to an LD which has deteriorated, the light-emitting output of the deteriorated LD is reduced in comparison with that when the same value of current is supplied to a normal LD. A factor in the deterioration could be a secular change of the characteristics at the semiconductor junction of the LD, or an electrostatic discharge failure at the semiconductor of the LD.

In an LD circuit having an APC circuit, in which the light-emitting output of the LD is sensed to feed-back control of the supplied current to the LD, based on the sensed light-emitting output so that the light-emitting output remains constant, if the LD has deteriorated, the supplied current may be abnormally increased, which may cause excess current in the LD, or an extraordinary increase in electric power consumption.

To prevent the problems caused by the deterioration of the LD as described above, a device that senses the deterioration of the LD has been proposed. In this device, a resistor is connected in series with a current supplying line connected to a LD drive circuit which supplies electric current to the LD through the current supplying line, and based on an electric voltage generated in the resistor, the deterioration is checked.

In the device, however, since the resistor is connected in series with the current supplying line, a voltage drop occurs because of the resistor, and the light-emitting output of the LD or an light-emitting efficiency may be decreased. Further, because the resister also functions as a damping resister, a responsiveness of the LD becomes low. Namely, especially in a laser scanning device in which a light-emitting control of the LD is carried out at a high speed, for example, in a laser scanning device in which the current supplying line is turned ON and OFF based on an image pattern signal so that a light-emitting operation of the LD is pulse-width controlled, the responsiveness of the LID relative to the ON-OFF controlled current is reduced. This may cause the accuracy of the image pattern to be decreased.

SUMMARY OF THE INVENTION

Therefore, an object of the invention is to provide a deterioration sensing device by which a deterioration of a light-emitting diode can be properly sensed without lowering the responsiveness of the light-emitting diode.

According to the present invention, there is provided a deterioration sensing device comprising a light-emitting diode, a light-emitting diode driver, a light-receiving diode, a data output processor, a light-emitting control circuit and a deterioration sensing circuit.

The light-emitting diode driver that supplies an electric power to the light-emitting diode so that the light-emitting diode performs a light-emitting operation to radiate a light beam. The light-receiving diode senses the light beam. The data output processor outputs light-emitting data in accordance with the light beam sensed by the light-receiving diode. The light-emitting control circuit controls the light-emitting diode driver based on the light-emitting data, so that the light-emitting diode performs the light-emitting operation to radiate the light beam at a constant intensity. The deterioration sensing circuit compares the light-emitting data with a standard data, so that the deterioration sensing circuit outputs a deterioration signal when a relationship between the light-emitting data and the standard data satisfies a predetermined condition.

Further, according to the present invention, there is provided a deterioration sensing device comprising a light-emitting diode driver, a light-receiving diode, a data output processor, a light-emitting control circuit and a deterioration sensing circuit.

The light-emitting diode driver supplies an electric power to the light-emitting diode so that the light-emitting diode radiates a light beam. The light-receiving diode senses the light beam. The data output processor outputs light-emitting data in accordance with the light beam sensed by the light-receiving diode. The light-emitting control circuit controls the light-emitting diode driver based on the light-emitting data, so that the light beam has a constant intensity. The deterioration sensing circuit compares the light-emitting data with a standard data, so that the deterioration sensing circuit outputs a deterioration signal in accordance with a difference between the light-emitting data and the standard data.

BRIEF DESCRIPTION OF THE DRAWINGS

The present invention will be better understood from the description of the preferred embodiments of the invention set forth below, together with the accompanying drawings, in which.

DESCRIPTION OF THE PREFERRED EMBODIMENTS

Figure 1:
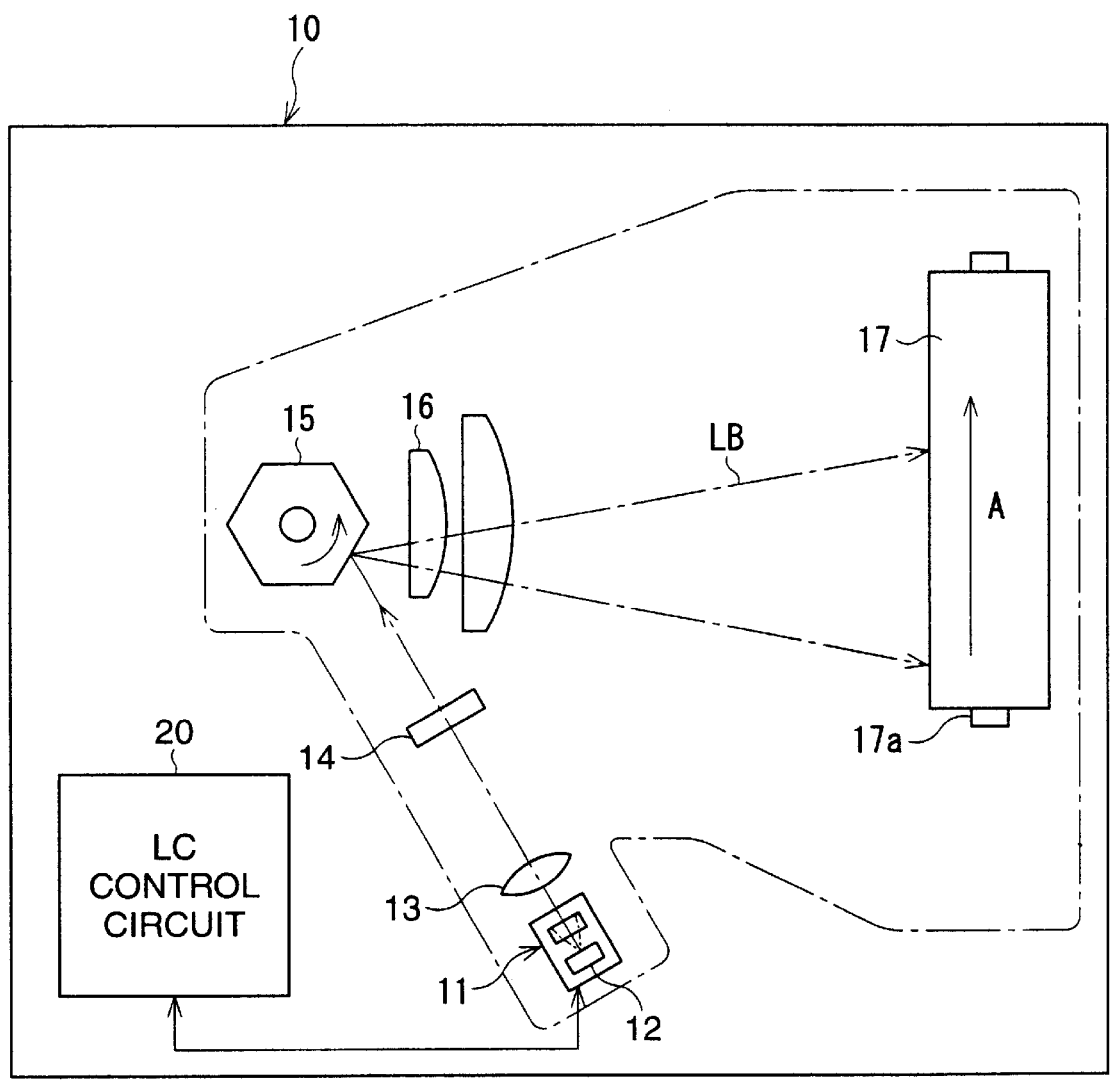
FIG. 1 is a schematic view showing an arrangement of components included in a laser scanning device to which the present invention is applied.

The present invention will be described below with reference to embodiments shown in the drawings.

FIG. 1 is a plan view showing an arrangement of components included in a laser scanning device to which the present invention is applied.

The laser scanning device 10 has a light-emitting diode or a laser diode (LD) 11, which is a light source. An LD control circuit 20 is connected to the LD 11, so that the LD 11 performs a light-emitting operation to radiate a laser light beam.

A photo-diode (PD) 12, which is a light-receiving diode, is provided in the LD 11 to sense an intensity of a laser beam LB radiated by the LD 11. The laser beam LB is changed to a parallel beam through a collimator lens 13, and passes through a cylindrical lens 14. Then, the laser beam LB is made incident on a reflecting surface of a polygon mirror 15, which is rotated at a high speed. By being reflected by the reflecting surface, the laser beam LB is directed to fθ lenses 16, and is scanned on a photo-sensitive surface of a photo-sensitive drum 17 in a direction shown by an arrow A, i.e., a main scanning direction. The photo-sensitive drum 17 has a rotation axis 17a, about which the photo-sensitive drum 17 is rotated so that the laser beam LB is moved on the photo-sensitive surface in a sub-scanning direction relative to the photo-sensitive drum 17. Thus, a predetermined image pattern, which is an electrostatic latent image, is formed on the photo-sensitive surface.

Figure 2:
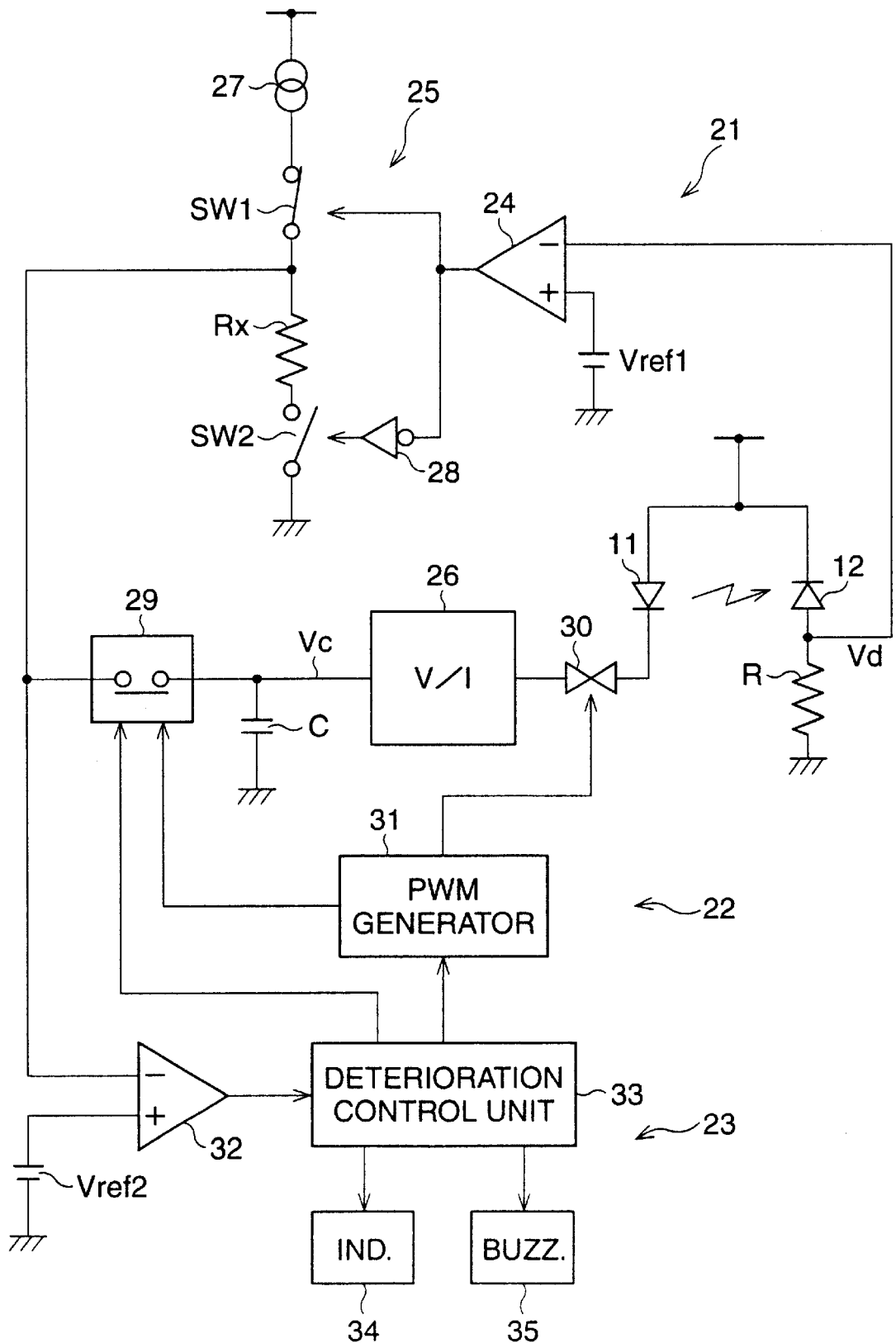
FIG. 2 is a block diagram showing a first embodiment of a deterioration sensing device.

FIG. 2 is a diagram showing the LD control circuit 20, which is provided with an APC circuit 21, a PWM modulation circuit 22 and a LD deterioration sensing circuit 23. The APC circuit 21 is provided for controlling the LD 11 to radiate a laser beam at a constant intensity. The PWM modulation circuit 22 is provided for carrying out a pulse width modulation in which a laser radiation of the LD 11 is ON-OFF controlled in accordance with an image pattern to be formed by the laser scanning device. The LD deterioration sensing circuit 23 is provided for sensing deterioration of the LD 11.

The PD 12 receives a laser beam radiated by the LD 11 to output an electric current corresponding to the intensity of the laser beam. The APC circuit 21 is provided with a resistor R, which is a current-voltage converter that converts a electric current output from the PD 12 to an electric voltage Vd, which is generated at both ends of the resistor R. The resistor R is connected between the PD 12 and the ground, i.e., connected to a passage where electric current of the PD 12 flows.

The LD control circuit 20 is provided with a data output circuit and a voltage-current converter (i.e., V/I converter) 26. The data output circuit controls the intensity of the laser beam radiated by the LD 11 based on the voltage Vd. Namely, the data output circuit outputs light-emitting data in accordance with a light beam sensed by the PD 12, and the voltage-current converter 26 supplies an electric power to the LD 11 based on the light-emitting data.

The data output circuit has a first comparator 24, a charge-discharge unit 25 and a capacitor C. The first comparator 24 has a first input terminal, to which the voltage Vd is input, and a second input terminal, to which a first reference voltage Vref1 is input. The charge-discharge unit 25 operates in accordance with an output signal of the first comparator 24. The capacitor C is charged or discharged in accordance with an output signal of the charge-discharge unit 25. The voltage-current converter 26 converts a voltage Vc of the capacitor C to electric current, which is supplied to the LD 11 to radiate a laser beam. Namely, the voltage-current converter 26 is a light-emitting diode driver by which the LD 11 is controlled.

The charge-discharge unit 25 has a electric current source 27, a first switch SW1 and a second switch SW2. The capacitor C is charged by the electric current source 27. The first switch SW1 is turned ON to connect the electric current source 27 to the capacitor C when a polarity of an output signal of the first comparator 24 is positive. The second switch SW2 is turned ON in accordance with an output of an inverter 28, connected to the first comparator 24, to connect the capacitor C to the ground through a resistor Rx, when a polarity of an output signal of the first comparator 24 is negative. An APC open switch 29 is provided between the charge-discharge unit 25 and the capacitor C. The APC open switch 29 is normally turned ON, and can be turned OFF to open the APC circuit 21 to stop an APC operation in which the intensity of the laser beam radiated by the LD 11 is controlled.

The PWM modulation circuit 22 has an electronic switch 30 and a PWM generator 31. The electronic switch 30 is provided between the LD 11, and is normally turned ON. The PWM generator 31 generates a pulse signal, a pulse width of which corresponds to data of the image pattern to be formed, and turns ON and OFF the electronic switch 30.

The LD deterioration sensing circuit 23 has a second comparator 32, a LD deterioration control unit 33. The second comparator 32 has a first input terminal, to which the voltage Vc of the capacitor C is input, and a second input terminal, to which a second reference voltage Vref2 is input. The second comparator 32 outputs a LD deterioration signal when the voltage Vc becomes higher than the second reference voltage Vref2. The LD deterioration control unit 33 performs a control in accordance with the deterioration signal output by the second comparator 32.

An alarm indicator 34 and an alarm buzzer 35 are connected to the LD deterioration control unit 33. The alarm indicator 34 includes a lamp, such as a light-emitting diode (LED), which is lit in accordance with the deterioration signal. The alarm buzzer 35 includes a piezoelectric element, which is sounded in accordance with the deterioration signal. The LD deterioration control unit 33 is connected to the APC open switch 29 and the PWM generator 31, so that the APC open switch 29 is turned ON and OFF, and the PWM generator 31 is compulsorily controlled.

An operation of the LD control circuit 20 is described below.

When a laser beam, radiated by the LD 11, is received by the PD 12, electric current corresponding to the intensity of the laser beam is generated in the APC circuit 21, and thus an electric voltage Vd corresponding to the current is generated in the resistor R. The voltage Vd is input to the first input terminal of the first comparator 24, in which the voltage Vd is compared with the first reference voltage Vref1 input to the second input terminal. When the voltage Vd is lower than the first reference voltage Vref1, a polarity of an output signal of the first comparator 24 is positive, and therefore, the first switch SW1 is turned ON and the second switch SW2 is turned OFF. Note that the APC open switch 29 is normally turned ON. Accordingly, the capacitor C is connected to the electric current source 27 of the charge-discharge unit 25 through the first switch SW1, an electric charge operation of the capacitor C is started. Since the voltage Vc of the capacitor C increases as the electric charge operation progresses, electric current output from the voltage-current converter 26 is increased, so that electric current supplied to the LD 11 is increased. Thus, the light-emitting output of the LD 11 is increased.

Since electric current generated in the PD 12 is increased in accordance with the increase of the light-emitting output of the LD 11, the voltage Vd is increased. Thus, when the voltage Vd becomes higher than the first reference voltage Vref1 in the first comparator 24, a polarity of an output signal of the first comparator 24 becomes negative.

Therefore, the first switch SW1 is turned OFF, and the second switch SW2 is turned ON. As a result, since the capacitor C is grounded through the APC open switch 29, the resistor Rx and the second switch SW2, discharge of the capacitor C is started. Since the voltage Vc of the capacitor C is lowered as the discharge progresses, electric current output from the voltage-current converter 26 is decreased. Namely, electric current supplied to the LD 11 is decreased, so that the intensity of the laser beam radiated by the LD 11 is decreased.

Thus, an APC control is performed, in which the supplied electric current to the LD 11 is feed-back controlled so that the voltage Vd becomes equal to the first reference voltage Vref1, and the intensity of the laser beam of the LD 11 is controlled to remain at a predetermined value.

While the APC control is performed, pattern data of an image, which is to be formed on the photo-sensitive drum 17, is input to the PWM generator 31, so that a pulse signal, having a pulse width corresponding to the pattern, is generated in the PWM generator 31, and thus the electronic switch 30 is turned ON and OFF in accordance with the pulse width. Due to this, a laser radiation of the LD 11 is controlled in accordance with a PWM modulation control, so that the pattern is formed on the photo-sensitive drum 17 by the laser beam LB scanning thereon. Note that the APC control is carried out only when the LD 11 radiates the laser beam LB.

In the LD deterioration sensing circuit 23, the voltage Vc of the capacitor C, which is now subjected to the APC control, is sensed and compared with the second reference voltage Vref2 in the second comparator 32.

Figure 3:
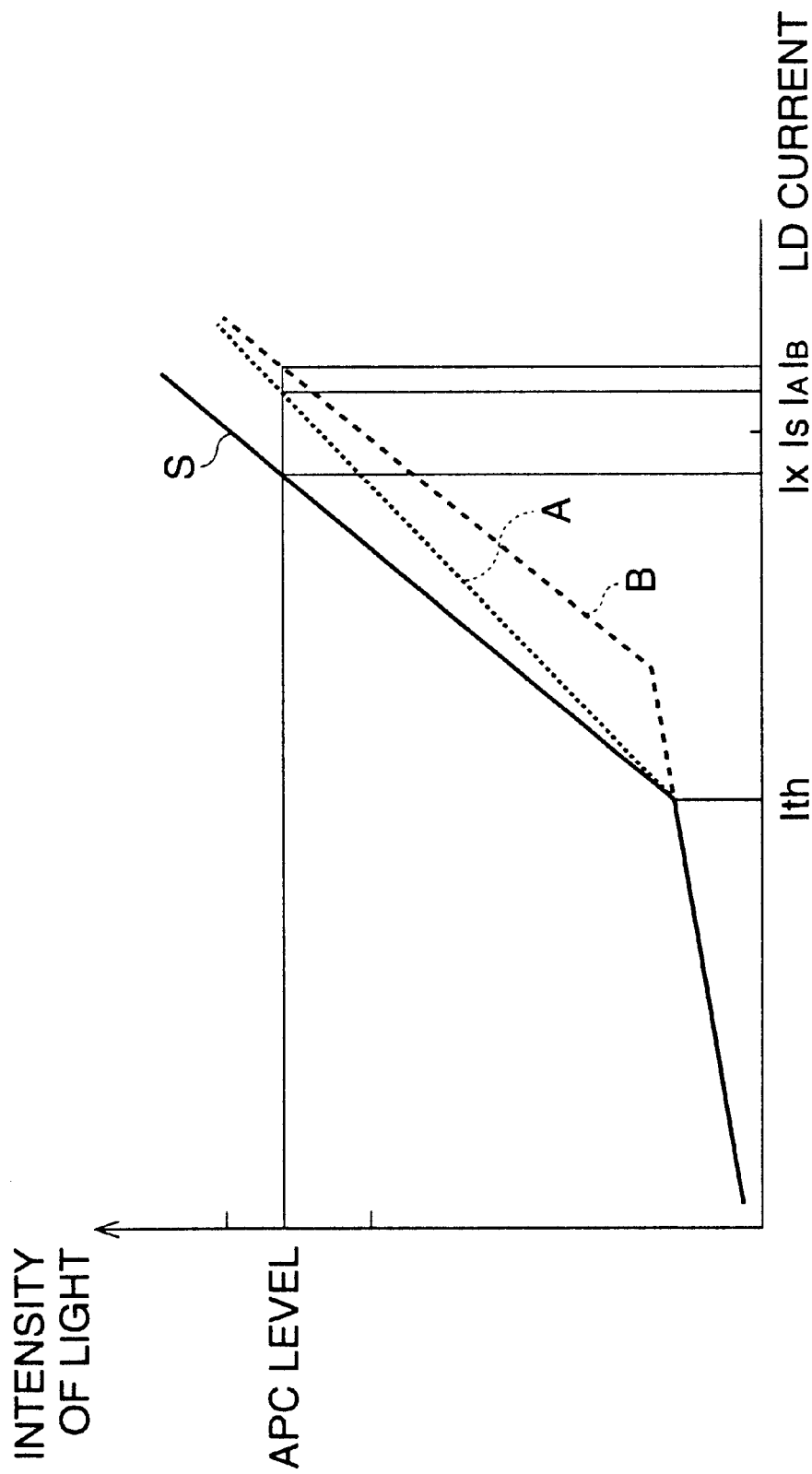
FIG. 3 is a graph showing characteristics of a laser diode.

FIG. 3 is a graph showing characteristics of the LD, i.e., a relationship between electric current supplied to the LD 11 and the intensity of a laser beam radiated from the LD 11. The intensity is linearly increased as the electric current is increased, and in a state in which the electric current is greater than a threshold value Ith at which the LD 11 begins to radiate a laser beam, the inclination of the linear relationship is greater than that of a state in which the electric current is less than the threshold value Ith.

When the performance of the LD 11 is normal, the laser beam intensity is varied along a line S. Conversely, when the LD 11 has deteriorated, the inclination becomes less as shown by a broken line A, or the threshold value becomes greater as shown by a broken line B. In either case, the laser beam intensity becomes low in comparison with a case in which the performance of the LD 11 is normal (i.e. the characteristics line S), even if the same electric current is supplied to the LD 11. In other words, if the laser beam intensity of the APC control is set to a predetermined APC level, electric current IA and IB, by which the APC level is obtained when the LD 11 has deteriorated, is greater than electric current Ix, by which the APC level is obtained when the LD 11 is normal.

Therefore, the second reference voltage Vref2 is set to a value corresponding to standard electric current Is which is supplied to the LD 11 so as to obtain the APC level at the point where the LD 11 begins to show deterioration. Thus, when the LD 11 has not deteriorated, electric current of the LD 11, by which the APC level is obtained, is relatively low, and thus, the voltage Vc of the capacitor C is lower than the second reference voltage Vref2. Namely, the deterioration signal is not output from the second comparator 32.

Conversely, when the LD 11 has deteriorated and the electric current of the LD 11, by which the APC level is obtained, becomes greater than the standard electric current Is, the voltage Vc of the capacitor C is increased and becomes greater than the second reference voltage Vref2. Therefore, the deterioration signal is output from the second comparator 32, so that the alarm indicator 34 is turned ON to indicate that the LD 11 has deteriorated, and further, the alarm buzzer 35 is turned ON to inform that the LD 11 has deteriorated.

Further, in the deteriorated state, when it is sensed that the LD 11 has deteriorated, the APC open switch 29 is turned OFF by the LD deterioration control unit 33, so that charge of the capacitor C is stopped. Thus, the capacitor C is disconnected from the charge-discharge unit 25, and thus, the charged voltage of the capacitor C is gradually lowered due to spontaneous discharge. Therefore, output electric current of the voltage-current converter 26 is gradually lowered, and thus, electric current supplied to the LD 11 is gradually decreased.

Thus, in the embodiment, the voltage Vc, input to the voltage-current converter 26 by which the laser beam intensity of the LD 11 is made constant, is sensed, and based on the sensed voltage Vc, an abnormal increase of the electric current supplied to the LD 11 is sensed so that the deterioration of the LD 11 is sensed. Accordingly, a resistor, by which electric current supplied to the LD 11 is sensed, need not be provided in the path of the electric current flow as in a conventional device. Therefore, according to the embodiment, a problem does not occur, in which the light-emitting efficiency, i.e., a ratio of the light-emitting output of the LD to a consumed electric power is decreased because of the voltage drop caused by the resistor. Further, since the resistor is not provided in the path of the electric current flow of the LD 11, a responsiveness of the LD 11 is not reduced because of an inductance component of the resistor. Therefore, the accuracy of the image pattern formed by the laser scanning device is increased, and thus the performance of the laser scanning device is improved.

Although the APC circuit 21 is an analog circuit in the above embodiment, the APC circuit can be formed by a digital circuit, as described below.

Figure 4:
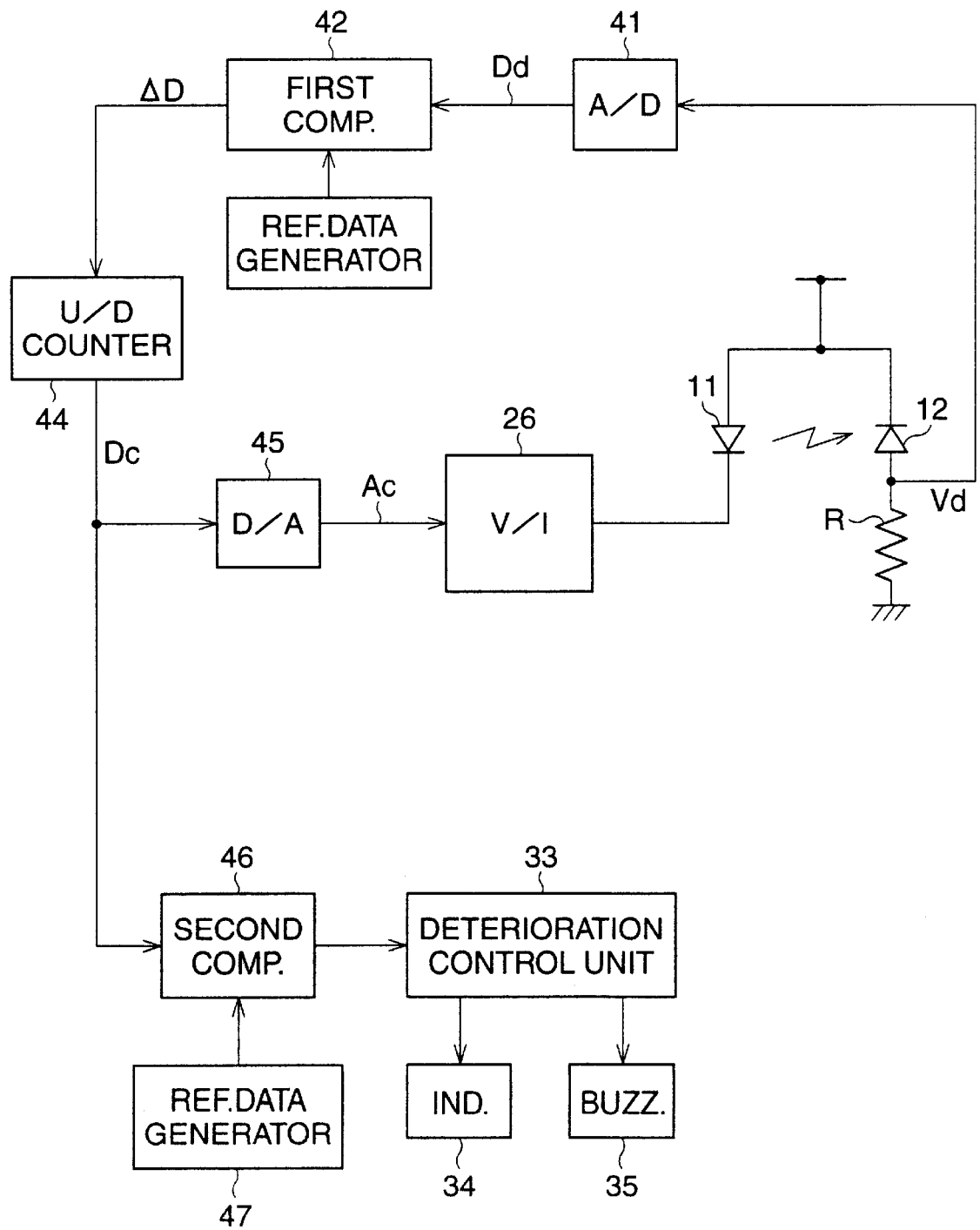
FIG. 4 is a block diagram showing a second embodiment of the deterioration sensing device.

Namely, FIG. 4 is a second embodiment in which the APC circuit is formed by a digital circuit. In FIG. 4, an element equivalent to that of FIG. 2 is indicated by the same reference numeral as in FIG. 2, and the PWM modulation circuit 22 (see FIG. 2) is omitted.

The voltage Vc, sensed by the resistor R connected to the PD 12, is A/D converted by an A/D converter 41, so that digital data Dd is obtained. In a first digital comparator 42, the digital data Dd is compared with a digital reference data which corresponds to a reference voltage and is generated in a reference data generator 43, so that a data differential ΔD between the digital data Dd and the digital reference data is output from the first digital comparator 42. The data differential ΔD is counted by an up/down counter 44 to obtain count data Dc, i.e., digital light-emitting data. The count data Dc is converted to an analog value Ac by a D/A converter 45. In the voltage-current converter 26, electric current corresponding to the analog value Ac is generated, and is supplied to the LD 11.

In a second comparator 46, the count data Dc output from the counter 44 is compared with digital reference data which is generated in a reference data generator 47, so that, in the LD deterioration control unit 33, increase of the electric current supplied to the LD 11 is sensed, and thus the deterioration of the LD 11 can be sensed.

As described above, in the second embodiment, the APC circuit 21 and the LD deterioration sensing circuit 23 are formed by the digital circuits, so that at least a part of the circuits can be replaced with a micro-computer, which is assembled in one chip. Further, the switches and the capacitor, which are provided in the analog circuit of the first embodiment, can be omitted. Therefore, the size of the electric circuit of the laser scanning device can be miniaturized, and the processing speed can be raised.

Note that the LD deterioration control unit 33 should have at least a function in which deterioration of the LD 11 is indicated, and the other functions of the LD deterioration control unit 33 can be omitted.

Although the embodiments of the present invention have been described herein with reference to the accompanying drawings, obviously many modifications and changes may be made by those skilled in this art without departing from the scope of the invention.

The present disclosure relates to subject matter contained in Japanese Patent Application No. 11-39763 (filed on Feb. 18, 1999) which is expressly incorporated herein, by reference, in its entirety.

What is claimed is:

1. A deterioration sensing device comprising:

a light-emitting diode;

a light-emitting diode driver that supplies an electric power to said light-emitting diode so that said light-emitting diode performs a light-emitting operation to radiate a light beam;

a light-receiving diode that senses said light beam;

a data output processor that outputs light-emitting data in accordance with said light beam sensed by said light-receiving diode;

a light-emitting control circuit that controls said light-emitting diode driver based on said light-emitting data, so that said light-emitting diode performs said light-emitting operation to radiate said light beam at a constant intensity; and a deterioration sensing circuit that compares said light-emitting data with a standard data, so that said deterioration sensing circuit outputs a deterioration signal when a relationship between said light-emitting data and said standard data satisfies a predetermined condition.

2. The device according to claim 1, further comprising an electric power control processor that controls said light-emitting diode driver to decrease supply of said electric power.

3. The device according to claim 1, wherein said data output processor comprises a first current-voltage converter that converts a first electric current, output from said light-receiving diode, to a first electric voltage, a first comparator that compares said first electric voltage with a first reference voltage to output a control signal, and an electric voltage generator that generates a second electric voltage corresponding to said voltage differential as said light-emitting data.

4. The device according to claim 3, wherein said light-emitting control circuit comprises a first voltage-current converter that converts said second electric voltage to a second electric current, which is supplied to said light-emitting diode driver.

5. The device according to claim 3, wherein said electric voltage generator comprises a switch operated on the bases of said control signal, and a capacitor that is charged or discharged in accordance with an ON-OFF state of said switch so that said light-emitting data is generated.

6. The device according to claim 3, wherein said deterioration sensing circuit comprises a second comparator that compares said second electric voltage with a second reference voltage, and outputs said deterioration signal when said second electric voltage becomes greater than said second reference voltage.

7. The device according to claim 1, wherein said deterioration sensing processor comprises an alarm indicator that lights a lamp in accordance with said deterioration signal.

8. The device according to claim 1, wherein said deterioration sensing processor comprises an alarm buzzer that sounds a buzzer in accordance with said deterioration signal.

9. The device according to claim 1, wherein said light-emitting diode is a laser diode.

10. The device according to claim 1, wherein said light-emitting diode is provided for forming a latent image on a photo-sensitive drum of a laser printer.

11. The device according to claim 1, wherein said data output processor comprises a second current-voltage converter that converts a first electric current, output from said light-receiving diode, to a third electric voltage, an A/D converter that converts said third electric voltage to digital data, a first digital comparator that obtains a data differential between said digital data and reference data, a counter that counts said data differential output from said first digital comparator to obtain said light-emitting data, and a D/A converter that converts said light-emitting data to a fourth electric voltage.

12. The device according to claim 11, wherein said light-emitting control circuit comprises a second voltage-current converter that converts said fourth electric voltage to a third electric current, which is supplied to said light-emitting diode driver.

13. The device according to claim 11, wherein said deterioration sensing circuit comprises a second digital comparator that compares said light-emitting data output from said counter with reference data, and outputs said deterioration signal when said light-emitting data becomes greater than said reference data.

14. A deterioration sensing device which senses a deterioration of a light-emitting diode provided in a laser scanning device, said device comprising:

a light-emitting diode driver that supplies an electric power to said light-emitting diode so that said light-emitting diode radiates a light beam;

a light-receiving diode that senses said light beam;

a data output processor that outputs light-emitting data in accordance with said light beam sensed by said light-receiving diode;

a light-emitting control circuit that controls said light-emitting diode driver based on said light-emitting data, so that said light beam has a constant intensity; and a deterioration sensing circuit that compares said light-emitting data with a standard data, so that said deterioration sensing circuit outputs a deterioration signal in accordance with a difference between said light-emitting data and said standard data.

* * * * *